US009992562B1

(12) United States Patent
Keong

(10) Patent No.: US 9,992,562 B1
(45) Date of Patent: Jun. 5, 2018

(54) LOUDSPEAKER HAVING PASSIVE HEAT DISSIPATION ASSEMBLY

(71) Applicant: Tymphany HK Limited, Wanchai (HK)

(72) Inventor: Hong Gee Keong, Taipei (TW)

(73) Assignee: TYMPHANY HK LIMITED, Wanchai (HK)

(*) Notice: Subject to any disclaimer, the term of this patent is extended or adjusted under 35 U.S.C. 154(b) by 0 days. days.

(21) Appl. No.: 15/370,173

(22) Filed: Dec. 6, 2016

(51) Int. Cl.
*H04R 1/02* (2006.01)
*H04R 1/28* (2006.01)
*H05K 7/20* (2006.01)

(52) U.S. Cl.
CPC ............ *H04R 1/02* (2013.01); *H04R 1/2834* (2013.01); *H05K 7/20163* (2013.01)

(58) Field of Classification Search
CPC .......... H04R 9/022; H04R 1/02; H04R 9/025; H04R 2209/041; H04R 9/06; H04R 1/345; H04R 1/403
See application file for complete search history.

(56) References Cited

U.S. PATENT DOCUMENTS 5,533,132 A * 7/1996 Button .................. H04R 1/028 181/199
6,549,637 B1 * 4/2003 Risch .................... H04R 9/022 181/160
7,177,439 B2 * 2/2007 Tardo .................... H04R 9/022 381/397
7,747,034 B2 * 6/2010 Watanabe ............. H04R 9/022 381/397
7,804,976 B1 * 9/2010 Parham ................. H04R 9/022 381/150
2013/0108099 A1 * 5/2013 Kemmerer ............ H04R 9/022 381/397

* cited by examiner

*Primary Examiner* — Mohammad Islam
(74) *Attorney, Agent, or Firm* — Cantor Colburn LLP

(57) ABSTRACT

A loudspeaker including a first housing which delimits a acoustic chamber, an acoustic driver disposed within the acoustic chamber, a second housing which delimits a second chamber disposed adjacent to the acoustic chamber, a heat source disposed within the second chamber, a passive radiator disposed in communication with the acoustic chamber and the second chamber, a vent disposed in communication with the second chamber and with an exterior of the loudspeaker, wherein the passive radiator is configured to move in response to a movement of the driver, where the passive radiator is further configured to direct an airflow proximate to the heat source during the movement of the passive radiator and to direct the airflow through the vent to the exterior of the loudspeaker.

13 Claims, 4 Drawing Sheets

LOUDSPEAKER HAVING PASSIVE HEAT DISSIPATION ASSEMBLY

TECHNICAL FIELD

The present disclosure relates to audio loudspeakers and more particularly to a to an air pump system for providing circulation and cooling within a loudspeaker.

BACKGROUND

Acoustic loudspeakers, such as those used in home audio and theater systems and in audio applications, typically include a driver and other electrical components disposed within a housing. These various elements produce heat during usage. Excess heat can negatively effect audio performance and prematurely degrade audio, electrical, and structural components.

Known attempts at dissipating heat build-up in audio equipment involve active systems, such as powered fans, or ineffective systems, such as underperforming vents. Other known arrangements utilize complex heat sink structures involving, for example, fins formed of specialized material. These known systems have failed to provide adequate cooling, have attenuated or otherwise degraded audio performance, and have added cost and complexity to the respective audio arrangements.

A loudspeaker is needed which includes an effective, simple, and economical arrangement for dissipating heat generated by the electrical components of the loudspeaker.

BRIEF SUMMARY

A loudspeaker is provided herein including a first housing which delimits a acoustic chamber, an acoustic driver disposed within the acoustic chamber, a second housing which delimits a second chamber disposed adjacent to the acoustic chamber, a heat source disposed within the second chamber, a passive radiator disposed in communication with the acoustic chamber and the second chamber, a vent disposed in communication with the second chamber and with an exterior of the loudspeaker, wherein the passivve radiator is configured to move in response to a movement of the driver, where the passive radiator is further configured to direct an airflow proximate to the heat source during the movement of the passive radiator and to direct the airflow through the vent to the exterior of the loudspeaker.

Also provided herein is a heat dissipation assembly for a loudspeaker including a driver disposed in an acoustic chamber and a heat source disposed outside of the acoustic chamber. The assembly, as disclosed, includes a non-powered passive radiator disposed in communication with the acoustic chamber and with the heat source, where the passive radiator is configured to undergo a movement in response to a movement of the driver and where the passive radiator is configured to direct an airflow to the heat source and to an exterior of the loudspeaker during the movement.

Additionally, a method of dissipating heat from a loudspeaker is provided herein, the method including delimiting an air-tight acoustic chamber, disposing a moveable driver in the acoustic chamber, disposing a passive non-powered passive radiator in communication with the acoustic chamber and with a heat source disposed outside of the acoustic chamber, moving the driver to result in a corresponding movement of the passive radiator, where the movement of the passive radiator directs airflow toward a heat source and to an exterior of the loudspeaker.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

DETAILED DESCRIPTION

Figure 1:
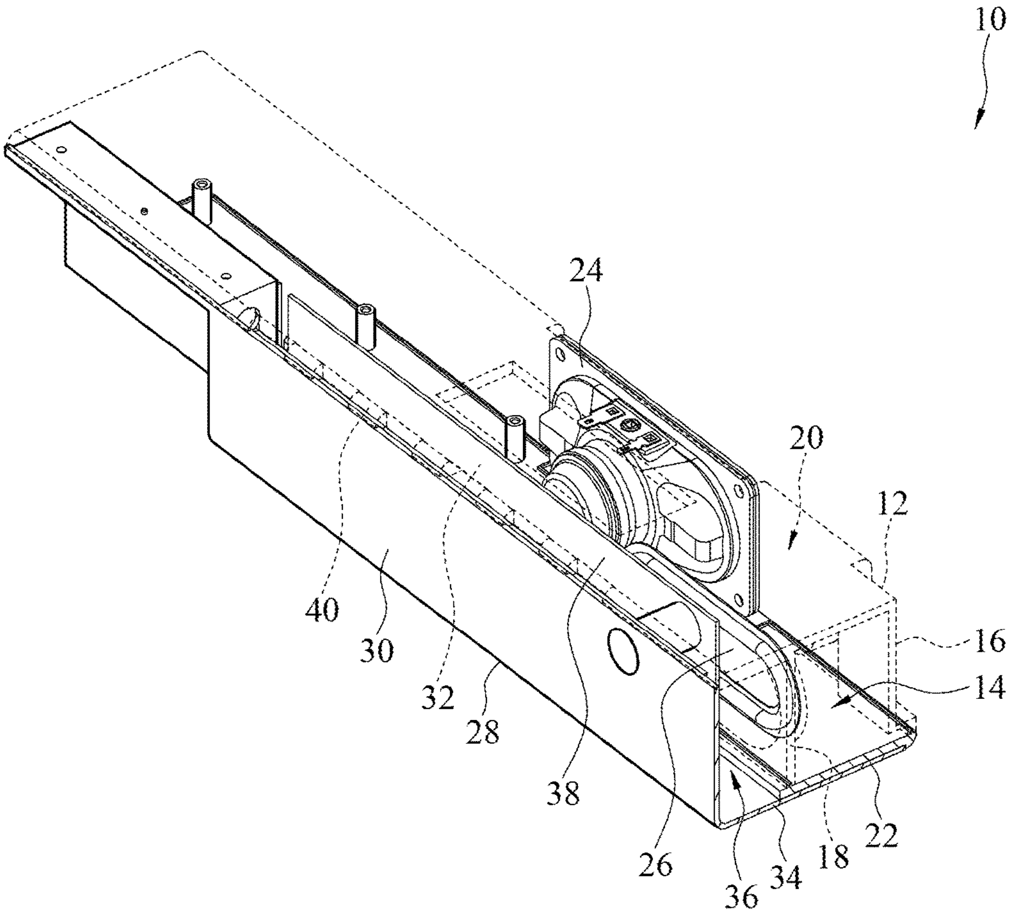
FIG. 1 is a cross-sectional partial view of a loudspeaker arrangement in an exemplary embodiment of the invention with some elements shown as transparent.
Figure 2:
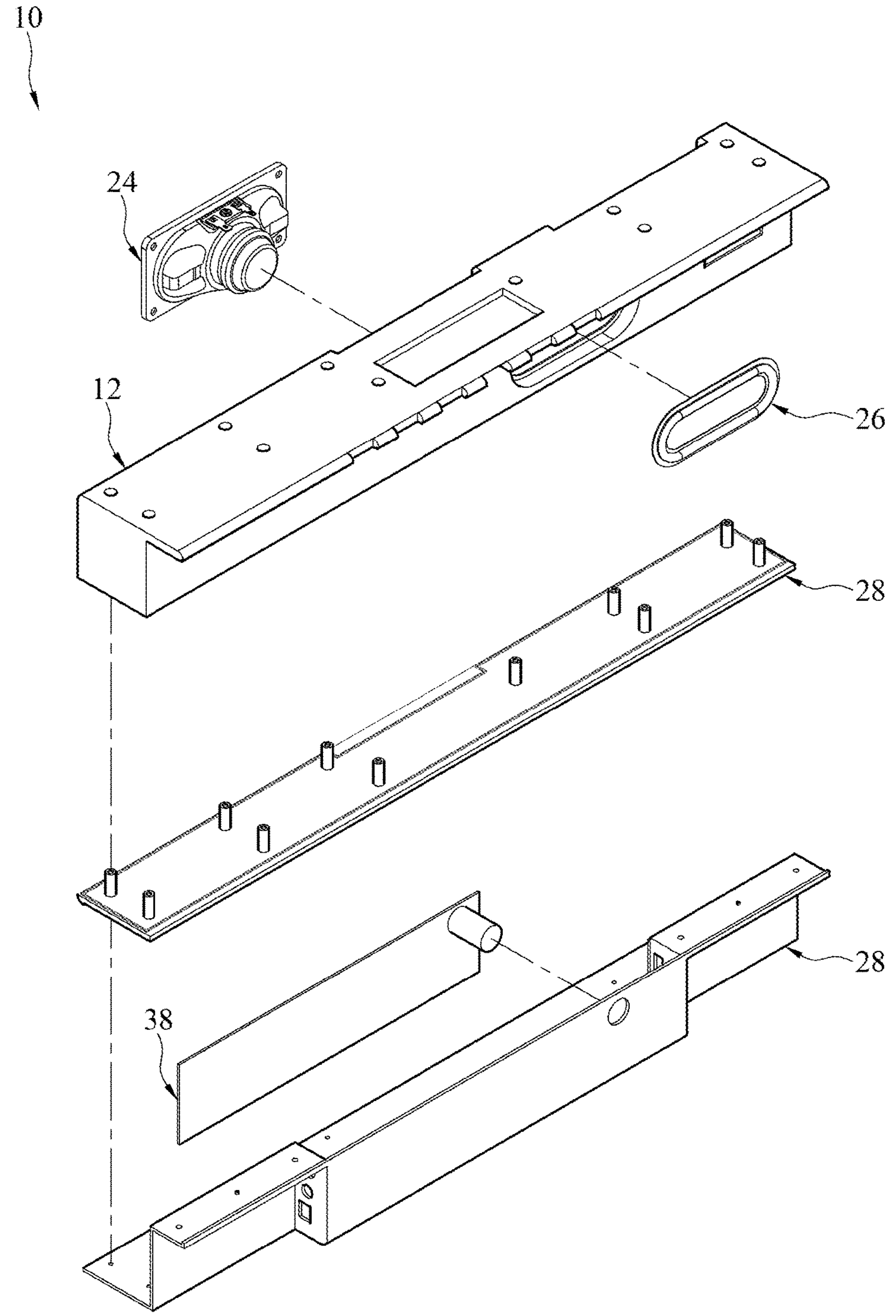
FIG. 2 is an exploded view thereof.

FIG. 1 illustrates a loudspeaker 10 having a first housing 12 which delimits an acoustic chamber 14. The acoustic chamber 14 is an airtight assembly which is isolated from an exterior of the loudspeaker 10 by structural components of the first housing 12. That is, the first housing 12 includes a front side 16, a rear side 18, a top side 20, a bottom side 22 and first and second opposing ends. These various sides and ends, in the illustrated embodiment, comprise panels which are connected to form, in this exemplary embodiment, an elongated parallelepiped shape that is sealed with respect to the exterior. The panels are integrally connected together or they are affixed by any suitable method, for example, by welding, bonding etc. As a result, the acoustic chamber 14 is not fluidly connected with the exterior and is hence isolated therefrom.

A driver 24 is disposed within the acoustic chamber 14 at the first side 16 of the first housing 12. The driver 24 is an electrically powered component configured to produce sound and to direct such sound to the exterior of the loudspeaker 10. A passive radiator 26 is disposed in the rear side 18 of the first housing 10. The passive radiator 26 is a non-powered, passive element which is configured to move in response to movements of the driver 24. For example, in one embodiment, the passive radiator 26 comprises a diaphragm with a surround extending around the diaphragm which permits an oscillating movement of the diaphragm, in this example, in a direction perpendicular to the rear side 18 of the first housing 12. As illustrated, the passive radiator 26 is generally oval in shape. However, this shape is merely exemplary. The passive radiator 26 may assume any desired shape sufficient for facilitating the desired movement thereof.

The loudspeaker 10 further includes a second housing 28 attached to and/or integral with the first housing 12 and essentially extending contiguously therewith. The rear side 18 of the first housing 12 forms a front side of the second housing 28. That is, in this embodiment, the rear side 18 of the first housing 12 extends internally within the loudspeaker 10 and is shared by the first and second housings 12, 28. The second housing 28 further includes a rear side 30, top and bottom sides 32, 34 and first and second opposing ends. These various sides and ends comprise panels which are connected to form, in this exemplary embodiment, an elongated parallelepiped shape. The panels are integrally connected together or they are affixed by any suitable conventional method, for example, by welding, bonding etc.

Figure 3:
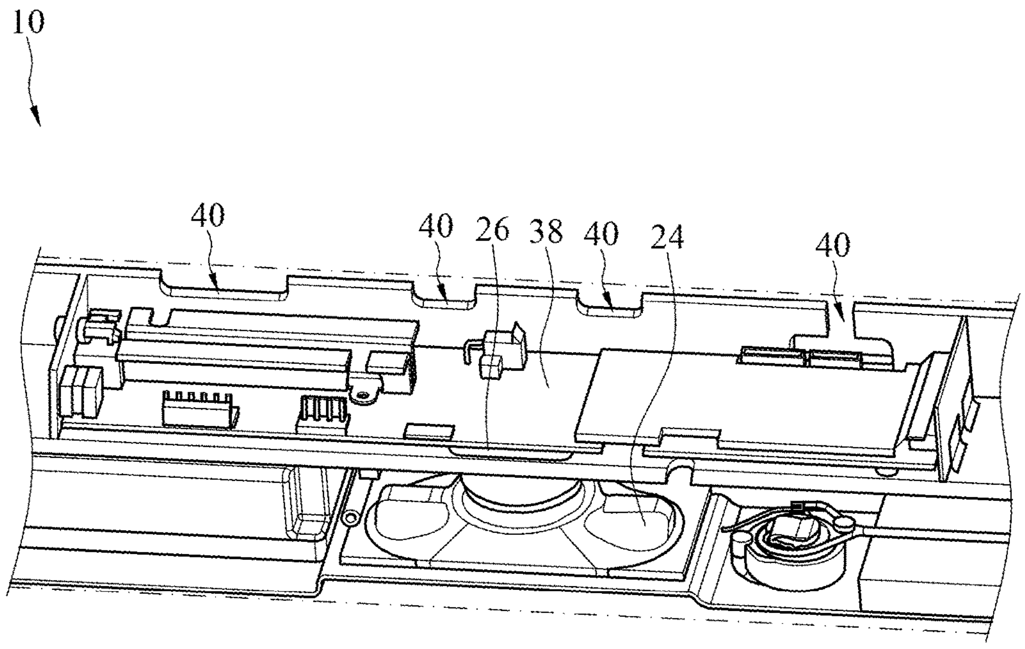
FIG. 3 is another cross-section partial view thereof with certain areas depicted in transparency.

The second housing 28 delimits a second chamber, such as a printed circuit board chamber 36 (hereinafter, "PCB chamber 36"). A printed circuit board assembly 38 (hereinafter, "PCBA 38") is disposed within the PCB chamber 36. The second housing 28 further includes a vent 40 which permits air within the PCB chamber 36 to move to the exterior of the loudspeaker 10 and which further permits air at the exterior to move into the PCB chamber 36. The vent 40 can take any form or structure sufficient to permit the desired airflow. For example, in one embodiment the vent 40 comprises a plurality of openings formed in one or more sides of the second housing 28. These openings create fluidic pathways from the PCB chamber 36 through the panels forming the various sides of the second housing 28, and to the exterior of the loudspeaker 10. FIG. 3 shows such exemplary vent openings 40 arranged proximate to the main PCBA 38. As illustrated, some of the vent openings 40 have rectangular shapes and vary in size. Other vent openings 40 are inverted T-shaped. The various vent openings 40 may be similarly shaped and sized or may vary in shape and/or size as desired for a particular application. For example, the vent openings 40 may be rectilinear and/or curvilinear and/or a combination thereof and may be of consistent or varying sizes.

Electrical components disposed in the PCB chamber 36 of the loudspeaker 10, such as the main PCBA 38, tend to emit heat when the loudspeaker 10 is in use. Left untreated, this accumulating heat could affect audio performance of the loudspeaker 10 or even damage the various electrical and magnetic elements of the loudspeaker 10. The loudspeaker dissipates this heat by creating airflow near the main PCBA and creating airflow through the vents 40 into and out of the PCB chamber 36. The driver 24 includes sound generating elements which move during use of the loudspeaker 10. Because the acoustic chamber 14 is an airtight sealed volume of air, the movements of the driver 24 propagate through the acoustic chamber 14 and are imparted upon the passive radiator 26 which is moved in correspondence with the movements of the driver 24. That is, the movement of the driver 24 creates a disturbance in the air foil of the acoustic chamber which imparts a force upon the passive radiator 26. Due to the structure of the radiator 26 which, in the current embodiment, includes a flexible surround extending about a diaphragm, the force directed upon the radiator 26 results in oscillation of the diaphragm. Force applied on the passive radiator 26 would move the diaphragm outward into the PCB chamber 36. However, this movement would be restrained by the flexible surround which would respond with a reactive force to return the diaphragm to a neutral position or to a negative position within the acoustic chamber. In this way, an oscillation of the passive radiator 26 would result. The movement of the passive radiator 26, in this example, is perpendicular to the rear side 18 of the first housing 12.

As the passive radiator 26 is forced into the PCB chamber 36, it correspondingly exerts a force on a volume of air. The passive radiator 26 is configured to direct the result airflow toward and around the main PCBA and in a direction toward the vents 40 so as to evacuate a certain volume of air form the PCB chamber 36. This movement of air within the PCT chamber dissipates heat from the main PCBA and directs the heat to the exterior of the loudspeaker 10.

As the passive radiator 26 reacts from its outward movement and is drawn back into the acoustic chamber 14, the volume of the PCB chamber is essentially increased, thus reducing air pressure within the chamber 36 and hence drawing air from the exterior through the vents 40 into the chamber 36. This ambient air which is brought into the PCB chamber 36 by the return movement of the passive radiator further serves to flush the chamber 36 and to dissipate heat from the main PCBA 38.

Figure 4:
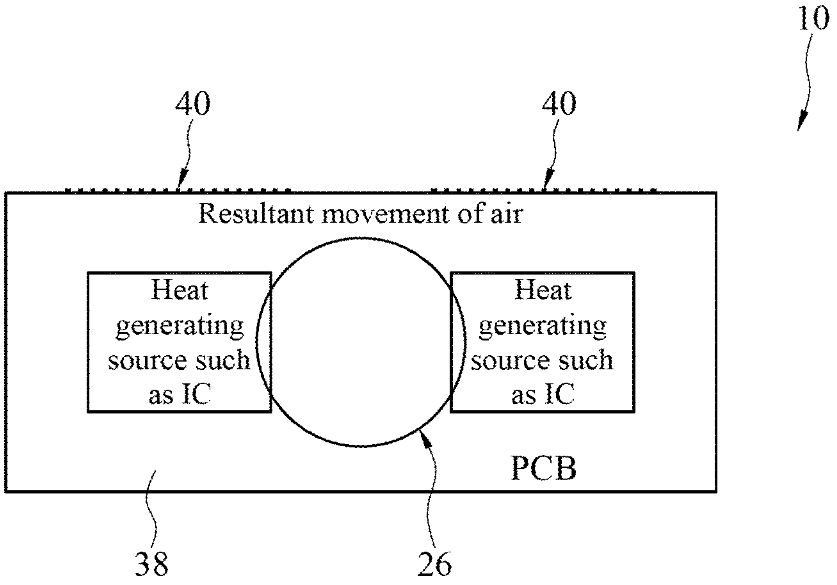
FIG. 4 is a schematic representation thereof.

FIG. 4 is a schematic representation of the loudspeaker 10 showing an exemplary disposition of the vents 40 relative to the passive radiator 26 and heat generating sources of the PCBA 38. As shown, the vents 40 are arranged adjacent to the heat generating sources of the PCBA 28. In this embodiment, the vents 40 are not placed in areas where there are no heat generating sources. The passive radiator 26 is also positioned in an area conducive to encourage airflow and circulation as described herein. In the illustrated embodiment, the passive radiator 26 is placed proximate to, but not directly aligned with, the heat generating sources of the PCBA 38 and the vents 40.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed:

1. A loudspeaker, comprising:

a first housing which delimits an acoustic chamber;

an acoustic driver disposed within the acoustic chamber;

a second housing which delimits a second chamber disposed adjacent to the acoustic chamber;

a heat source disposed within the second chamber;

a passive radiator disposed in communication with the acoustic chamber and the second chamber;

a vent disposed in communication with the second chamber and with an exterior of the loudspeaker;

wherein the passive radiator is configured to move in response to a movement of the acoustic driver;

wherein said passive radiator is further configured to direct an airflow proximate to the heat source during said movement of the passive radiator and to direct said airflow through the vent to the exterior of the loudspeaker.

2. The loudspeaker of claim 1, wherein the passive radiator is a passive diaphragm assembly disposed in a rear side of the first housing and including a flexible surround extending around a diaphragm element.

3. The loudspeaker of claim 2, wherein the second housing is arranged adjacent to the rear side of the first housing, the passive diaphragm assembly having a first side disposed within the acoustic chamber and a second opposite side disposed within the second chamber.

4. The loudspeaker of claim 3, wherein the first and second housings are arranged contiguously such that the rear side of the first housing forms a front wall of the second housing.

5. The loudspeaker of claim 1, wherein the heat source comprises a printed circuit board assembly.

6. The loudspeaker of claim 1, wherein the vent comprises an opening formed through a rear side of the second housing.

7. The loudspeaker of claim 6, wherein the vent comprises a plurality of openings formed through the rear side and arranged proximate to the heat source.

8. The loudspeaker of claim 1, wherein the passive radiator is a non-powered element configured to move with respect to the acoustic chamber and the second chamber as a result of a change in air pressure in at least one of the chambers.

9. The loudspeaker of claim 1, wherein said movement of the passive radiator increases or decreases the air pressure within the second chamber in order to said direct the airflow relative to the heat source and relative to the vent.

10. A heat dissipation assembly for a loudspeaker including a driver disposed in an acoustic chamber and a heat source disposed outside of the acoustic chamber, the assembly comprising:

a passive radiator disposed in communication with the acoustic chamber and with the heat source;

wherein the passive radiator is configured to undergo a movement in response to a movement of the driver and wherein the passive radiator is configured to direct an airflow to the heat source and to an exterior of the loudspeaker during said movement.

11. The heat dissipation assembly of claim 10, further comprising a second chamber comprising vents which extend from an interior of the second chamber to an the exterior of the loudspeaker, wherein the heat source is disposed within the second chamber.

12. The heat dissipation assembly of claim 11, wherein the passive radiator comprises a moveable diaphragm disposed in an intermediary wall which separates the acoustic chamber and the second chamber and wherein the vent comprises a plurality of openings formed in one or more panels which delimit the second chamber.

13. A method of dissipating heat from a loudspeaker, comprising:

delimiting an acoustic chamber;

disposing a moveable driver in the acoustic chamber;

disposing a passive radiator in communication with the acoustic chamber and with a heat source disposed outside of the acoustic chamber;

moving the driver to result in a corresponding movement of the passive radiator;

wherein said movement of the passive radiator directs airflow toward a heat source and to an exterior of the loudspeaker.

* * * * *